United States Patent [19]
Merritt

[11] Patent Number: 5,978,302
[45] Date of Patent: Nov. 2, 1999

[54] MULTI-BANK ARCHITECTURE FOR A WIDE I/O DRAM

[75] Inventor: Todd A. Merritt, Boise, Id.

[73] Assignee: Micron Technology, Inc., Boise, Id.

[21] Appl. No.: 09/076,488

[22] Filed: May 13, 1998

[51] Int. Cl.[6] .................................................... G11C 8/00
[52] U.S. Cl. ............................... 365/230.03; 365/230.06; 365/51
[58] Field of Search .......................... 365/230.03, 230.06, 365/205, 63, 51, 52

[56] References Cited

U.S. PATENT DOCUMENTS 5,406,526  4/1995  Sugibayashi et al. ............. 365/230.03
5,636,174  6/1997  Rao .................................... 365/230.03

Primary Examiner—David Nelms
Assistant Examiner—Hoai V. Ho
Attorney, Agent, or Firm—Dickstein Shapiro Morin & Oshinsky LLP

[57] ABSTRACT

An architecture for a multi-bank DRAM is described which utilizes banks which are staggered in order to increase the amount of data which can be accessed at any one time. The banks are staggered such that a portion of each bank is provided on opposite sides of a data path so that a single address can simultaneously specify both portions of the bank so that twice the amount of data can be accessed.

20 Claims, 6 Drawing Sheets

MULTI-BANK ARCHITECTURE FOR A WIDE I/O DRAM

BACKGROUND OF THE INVENTION

1. Field of the Invention

This invention relates to semiconductor memory devices and, in particular, to dynamic random access memory devices (DRAMs) arranged in banks for providing increased data access speed and data throughput.

2. Description of the Related Art

There is an ever increasing need for access speed and throughput in a memory device to meet the demands of ever faster generations of processors. One common type of memory device used with processors is a dynamic random access memory (DRAM). DRAMs comprise an array of individual memory cells. The memory array consists of a multitude of rows and columns, where the intersection of each row and column defines a memory cell. Typically, each DRAM memory cell comprises a capacitor for holding a charge and an access transistor for accessing the capacitor charge. The charge is representative of a data bit and can be either high voltage or low voltage (representing, e.g., a logical "1" or a logical "0", respectively). Data can be stored in memory during write operations or read from memory during read operations.

DRAMs are usually classified by the number of data paths or input/outputs (I/Os) they provide. The data paths are passageways for information to travel to and from the DRAM. When information is being written to the memory, these paths function as input paths, when information is being read from the memory, these paths function as outputs. As is evident, the more data paths, the greater the throughput of the memory. DRAMs which have 16 or more data paths (I/Os) are often referred to as "wide" DRAMs.

Refresh, read, and write operations in present-day DRAMs are typically performed for all cells in one row simultaneously. Data is read from a memory cell by activating a row, referred to as a word line, which couples all memory cells corresponding to that row to digit or bit lines which define the columns of the array. When a particular word (row) line is activated, sense amplifiers detect and amplify the data present on an active bit (column) line. In order to access a particular bit (memory cell) in the memory array, the DRAM operating system selects the particular row and column corresponding to that bit, and the sense amplifier determines whether a "1" or a "0" has been stored in the memory location. The operation of DRAM sense amplifiers is described, for example, in U.S. Pat. Nos. 5,627,785; 5,280,205; and 5,042,011, all assigned to Micron Technology Inc. and incorporated by reference herein.

It is well known in the art to arrange the memory cells of a DRAM into operative units, also referred to as memory banks. In such a structure, separate banks of memory cells are arranged to feed into a common data path. An example of this type of architecture in shown in FIG. 1.

FIG. 1 shows a multi-bank DRAM which includes two banks of memory cells, namely B0 and B1. Each bank also includes several memory cell sub-banks 50, e.g. each bank B0 and B1 includes 8 respective sub-banks arranged into groups of four (B0a, B0b, B1a, B1b) in the FIG. 1 architecture. These groups will hereinafter be referred to as the "a" and "b" groups. The sub-banks 50 each have respective row decoders 30 and sense amplifier lines 10, which separate the sub-banks 50 from one another. The sense amplifier lines 10, as is well known in the art, sense and amplify the signals present on the bit lines (i.c. the columns of the memory array). The DRAM shown in FIG. 1 is of the "wide" type, providing 16 data lines for input and output functions, arranged in a data path area 40, located between the memory banks B0 and B1.

Each bank B0, B1 includes a separate column decoder 20 for addressing a particular column or set of columns in the bank. The columns of the bank are also referred to as bit lines because they provide a path for the bits of information to travel to and from the memory cells. The column decoder 20 receives an address from an address buffer (not shown) or similar device which specifies the particular column or columns which will be addressed. The column decoder, in turn, activates particular columns of the memory array depending on the address which is specified. By "activates" it is meant that a voltage is applied to one end of the column line in order to make it active.

Each bank B0, B1 also includes three row decoders 30 for addressing a particular row within a sub-bank 50. The row decoders 30 also receive an address from an address buffer (not shown), and energize a particular row in a sub-bank depending on the address specified. The energizing of a row serves to turn on all the gates of the transistors located in that row, thereby allowing cell access. The manner in which the row decoders operate to address a given group of sub-banks (e.g. B0a, B0b, B1a, B1b) is illustrated in FIG. 4. The outside row decoders 31 address word lines in their respective sub-banks (B0a, B0b, B1a, B1b), while the interior row decoder 32 addresses word lines in both adjacent sub-banks.

The data path 40 provides a plurality of input/output (I/O) lines, shown as 41, which serve to read data from and write data to the memory sub-banks. As stated above, in the particular DRAM illustrated, 16 I/O lines are provided, but prior art DRAMs presently exist with up to 1024 I/O lines. As shown in FIG. 3, when the particular rows and columns from which data is to be retrieved are energized by the row and column decoders, the sense amplifier lines 10 determine the content of each memory location and output either a "1" or a "0". These outputs are relayed to out board logic circuitry by the, e.g. 16, I/O lines which are located in the data path 40.

In the particular device illustrated in FIGS. 1, 3, or 4, the column decoder is simultaneously addressing 8 bit lines at a time in each of two non-adjacent sub-banks located within the same bank (B0 or B1). Further, only one group of sub-banks "a" or "b" within a selected bank is addressed at a time. This means that either a first and third, or a second and fourth sub-banks, in either group "a" or "b", are energized at any one time. This is accomplished by enabling two "column select" lines through the column decoder. Each "column select" line energizes 4 physical columns within each of the two selected non-adjacent sub-banks. The row decoder, at the same time, addresses one row in each of the two selected sub-banks. In other words, the column and row decoders together specify 8 columns in each of the two non-adjacent selected sub-banks, with each column providing 1 bit, for a total of 8 bits per sub-bank. Since two sub-banks are being simultaneously addressed, this results in a 16 bit output from a memory bank (B0 or B1).

FIG. 3 shows a portion of one of the sub-banks 50 in either bank B0 or B1. Each time information is to be read from the memory, the row decoder 30 selects a particular row in each of two non-adjacent sub-banks 50 by sending a signal on the particular word line, for example WL0 in each sub-bank, which energizes the gates of all the transistors in that row. Once the particular row has been energized, the voltage stored on the capacitors of the associated transistors, in this case capacitors C1–C4, discharges onto the bit lines and travel towards the sense amplifiers located at the top and bottom of the selected sub-banks. Again for simplicity, only the sense amplifiers located above the sub-bank are shown in FIG. 3. The sense amplifiers detect the signals present on each bit line BL0–BL3 and translate them to either a logic "1" or logic "1", depending upon the voltage stored on the capacitor. The column decoder 20 then chooses a particular column or columns by sending a column select signal to the transistors T0–T3. In this case, the column decoder 20 addresses 8 bit lines at a time by sending two "column select" signals. However, for simplicity, FIG. 3 only shows 4 of the bit lines being addressed, namely BL0–BL3. This corresponds to the activation of one "column select" line. The data is placed on lines D0–D3 and run through a DC sense amplifier or helper flip-flop within the data path to output lines. Each sense amp stripe located above and below a selected sub-bank gathers 4 bits of data, for a total of 16 bits from the two selected sub-banks.

Referring again to FIG. 1, each sense amplifier stripe provides 4 bits of data as described above for each sub-bank 50. However, the column and row decoders can only select memory locations in either the 4 "a" sub-banks located on the left of a bank or the 4 "b" sub-banks 50 located on the right of the bank. Moreover, only bank B0 or B1 can be addressed at a time. This is because there is a limited number of addresses pins incoming to the memory device to address the different memory locations. The limited number of address pins only allows 2 rows and 8 columns to be addressed for the either of the "a" or "b" sub-banks, in either bank B0 or B1. Thus, the total number of bits that are provided on the data path at any one time in the prior art FIG. 1 arrangement is 16. It would be desirable to output larger numbers of bits simultaneously from the multi-bank memory device illustrated in FIG. 1.

SUMMARY OF THE INVENTION

The invention provides a multi-bank DRAM which has an increased data throughput by rearranging the memory banks B0 and B1 in such a way that at least twice the number of data bits can be accessed in a memory access operation. In the DRAM of the present invention a portion of each of the given memory banks, e.g. B0, B1 is split so half of it is on one side of a data path and the other half is on the other side of the data path. By rearranging the portions (B0a, B0b and B1a, B1b) of the data banks B0 and B1 to be on either side of the data path both portions of a given data bank can be accessed simultaneously e.g. B0a and B0b with the same address signal, thereby enabling the memory device with the FIG. 2 arrangement to input/output twice as many bits at a time as could be achieved with the FIG. 2 arrangement, e.g. 32 bits instead of 16 bits.

This increase in data throughput is obtained without increasing the number of address pins for the memory device or the overall number of memory cells.

The above and other advantages and features of the present invention will be better understood from the following detailed description of the preferred embodiment of the invention which is provided in connection with the accompanying drawings.

DETAILED DESCRIPTION OF THE PREFERRED EMBODIMENTS

A preferred embodiment of the invention will next be described with reference to the above-mentioned drawings.

Figure 1:
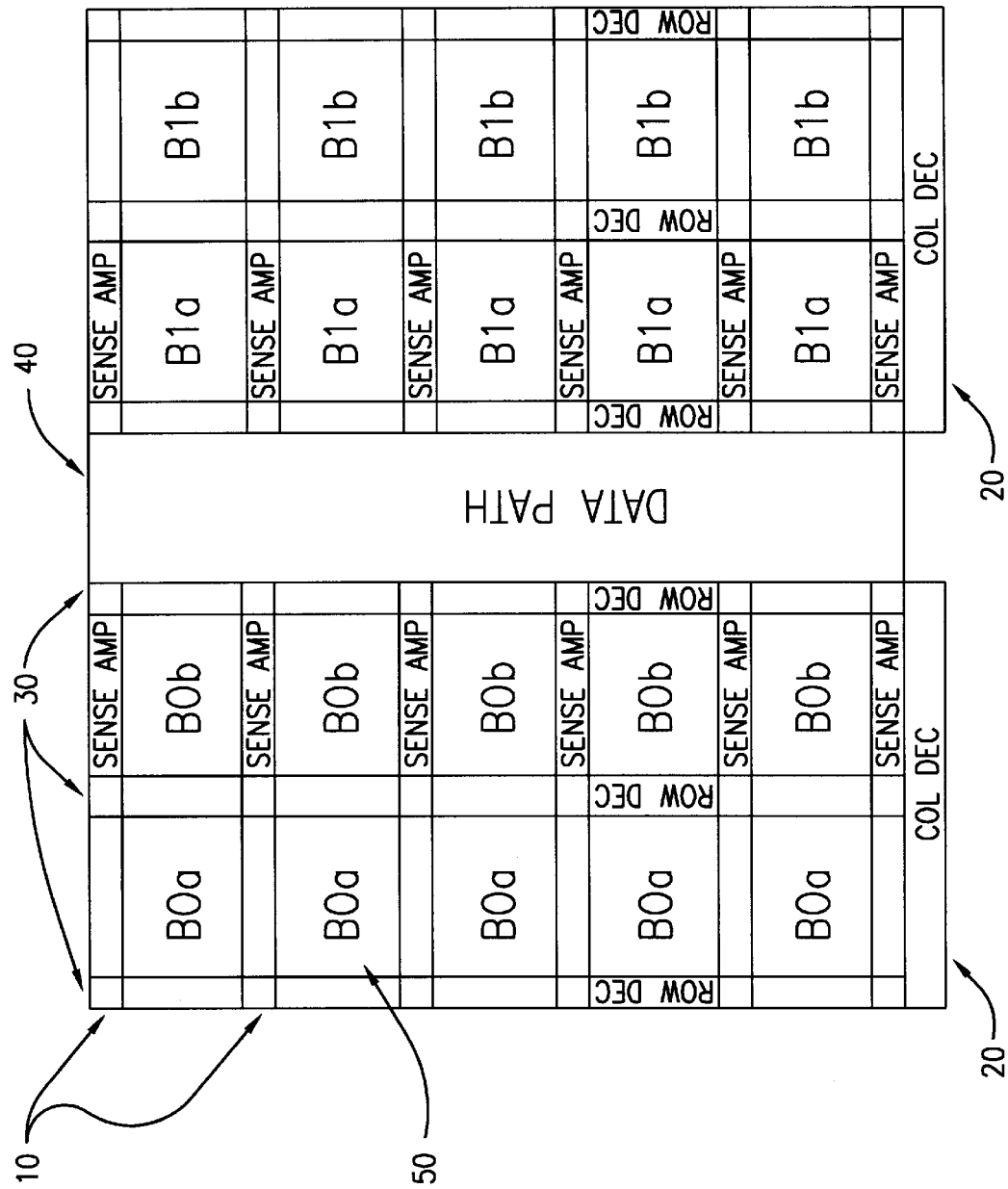
FIG. 1 shows a prior art multi-bank DRAM architecture.
Figure 2:
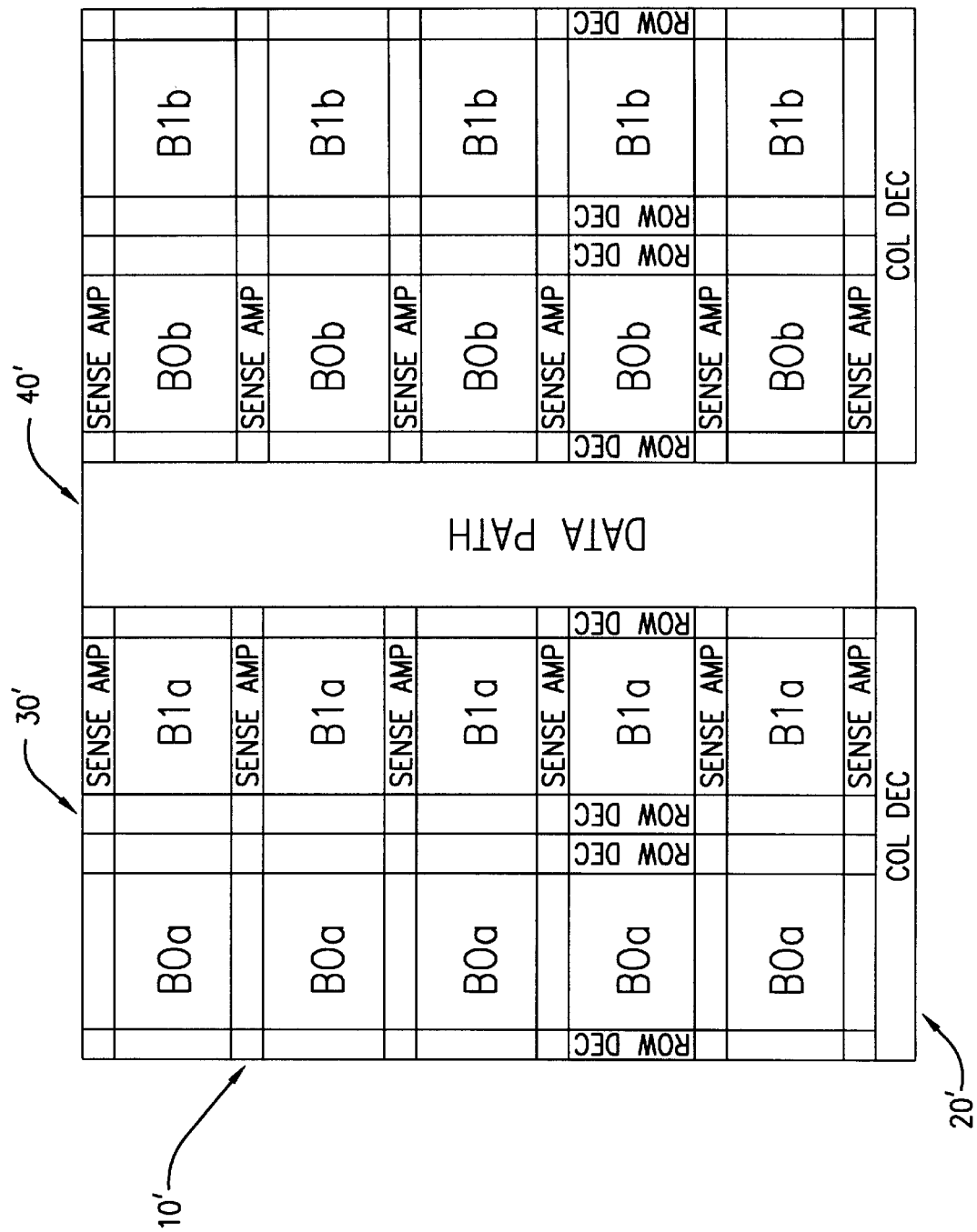
FIG. 2 shows the multi-bank DRAM architecture of the present invention.
Figure 3:
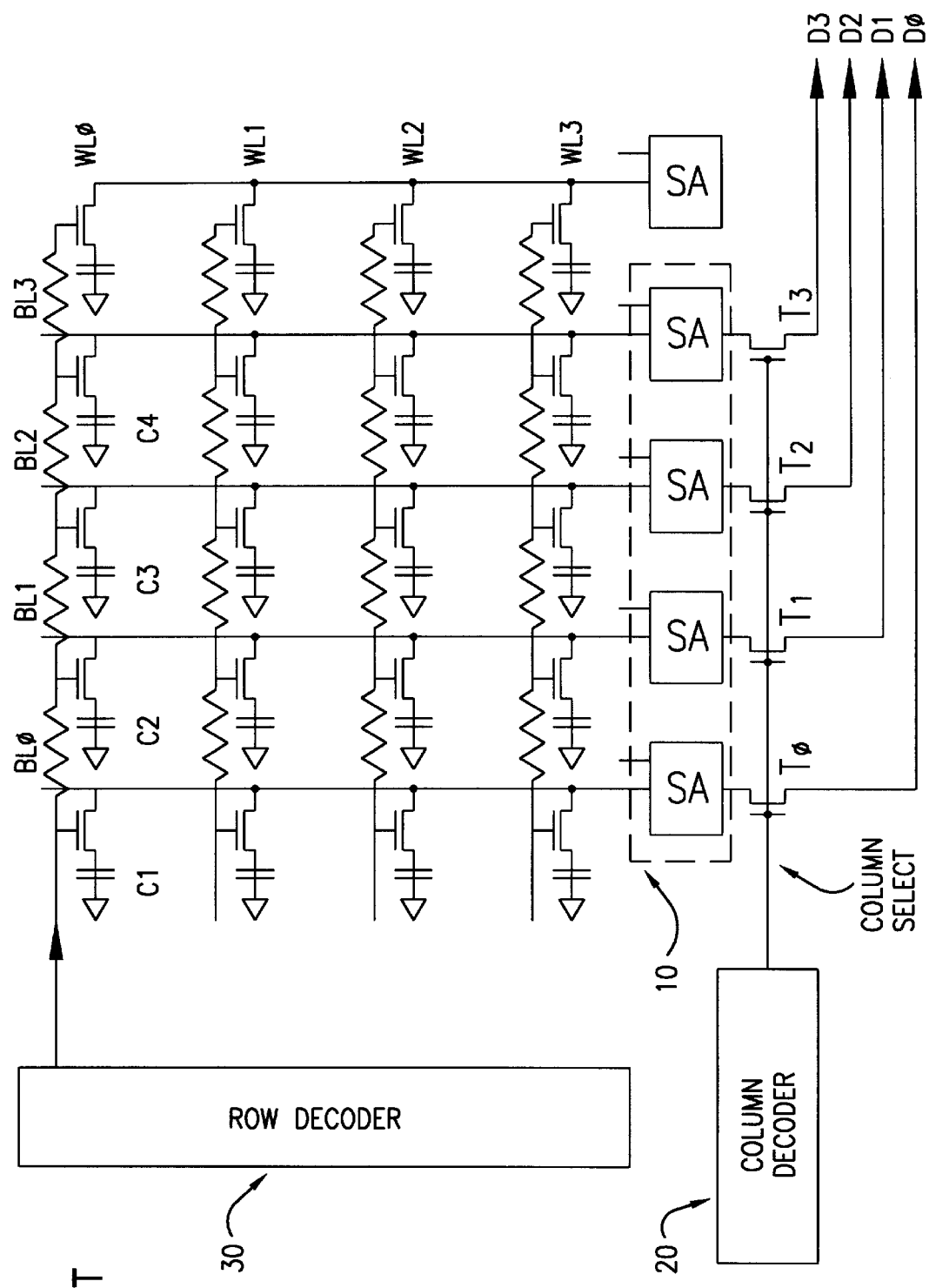
FIG. 3 shows an example of a portion of the FIG. 1 prior art memory cell.
Figure 4:
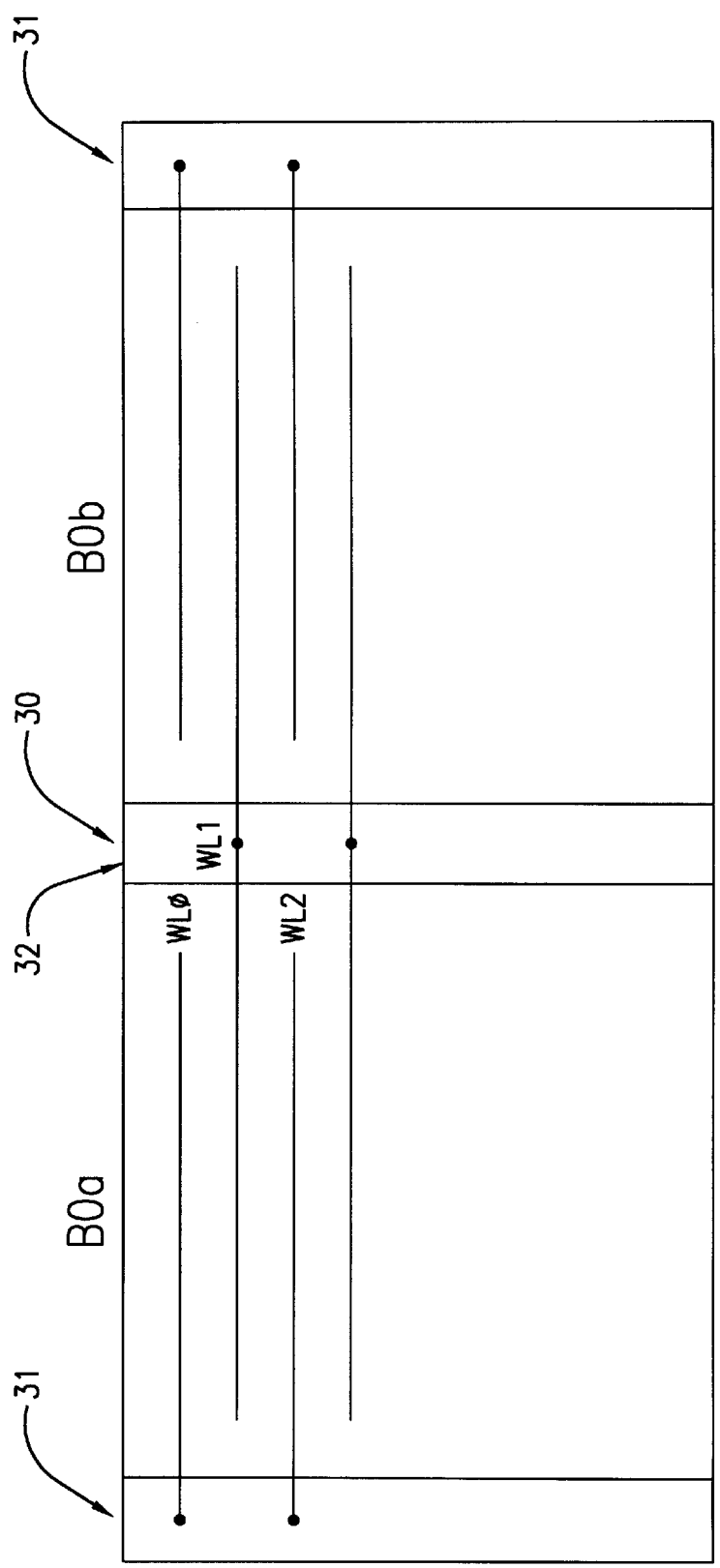
FIG. 4 shows an example of a portion of the FIG. 1 prior art memory array addressed by three row decoders.
Figure 5:
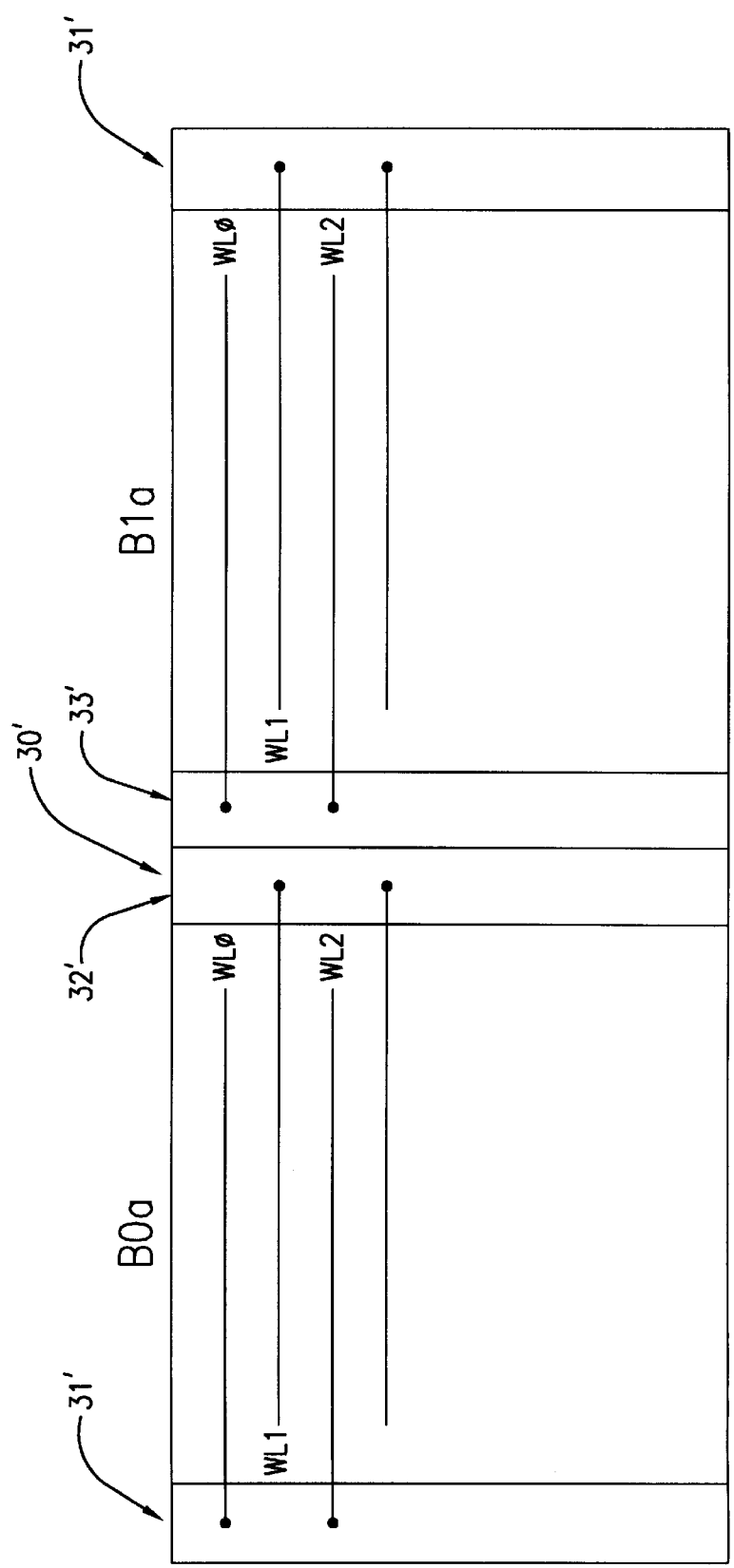
FIG. 5 show an example of the preferred embodiment of the present invention where a memory array is addressed by four row decoders.

FIG. 2 shows the architecture of multi-bank DRAM constructed in accordance with the present invention. The major difference between this DRAM architecture and that shown in FIG. 1 is that the B0a, B0b and B1a, B1b portions of the DRAM banks B0 and Bi are staggered. Thus, instead of having all 8 sub-banks 50' of bank B0 on the same side of the data path, half B0a are placed on one side of the data path and half B0b are placed on the other side. The same is done for the sub-banks 50' of bank B1. This staggering of the banks allows more bits of data to be extracted each time the memory is accessed by a given address. Since the number of address pins limits the amount of data that can be retrieved at any one time, the banks B0 and B1 are arranged in such a way that a single address can simultaneously specify memory locations on opposite sides of the data path 40'. Since the row decoder 30' must specify either bank B0 or B1 on each side of the data path, an extra row decoder area 33' (shown more particularly in FIG. 5) is now required to address the rows of each bank B0 and B1. This configuration is quite different from the prior art configuration shown in FIG. 4, which includes only three row decoder stripes (31,32,31). In the arrangement of FIG. 4, the central row decoder 32 was used to access both banks B0a and B0b. By contrast, in the present invention, as illustrated in FIG. 5, a pair of row decoders (comprised of row decoder stripes 31',32' and 31', 33') is provided for each sub-bank. In FIG. 5, the sub banks for sections B0a and B1a are shown, but the arrangement is identical for the sub banks of sections B0b and B1b. This arrangement enables simultaneous addressing of rows in the sub-banks B0a and B0b or B1a and B1b.

The basic operation of the staggered architecture will next be described in connection with a read operation. When data is to be retrieved from a memory location in the FIG. 2 architecture, an address signal (not shown) specifying that memory location is sent to the column decoders 20' and row decoders 30' on both sides of the data path 40'. The column and row decoders on each side of the data path access an identical location or locations of their respective sides of the data path for read data. In the present embodiment, the specified address is relayed to the column decoders 20', and row decoders 30' for each side of the data path, rather than to just one side at a time as in the prior art. Since in the example given each address specifies 8 bits of data in each of two selected non-adjacent sub-banks 50', the portion of B0a located to the left of the data path 40' gathers 16 data bits (i.e., 8 bits per sub-bank), and the portion B0b located on the right of the data path 40' gathers another 16 data bits for a total of 32 data bits retrieved, which are provided on 32 I/O lines 41' in the data path 40'. Although a read operation was just described, the same memory access occurs for a write operation as well. Hence, the architecture of the present invention illustrated in FIG. 2 doubles the amount of data that can be accessed at any one time from a memory array.

Figure 6:
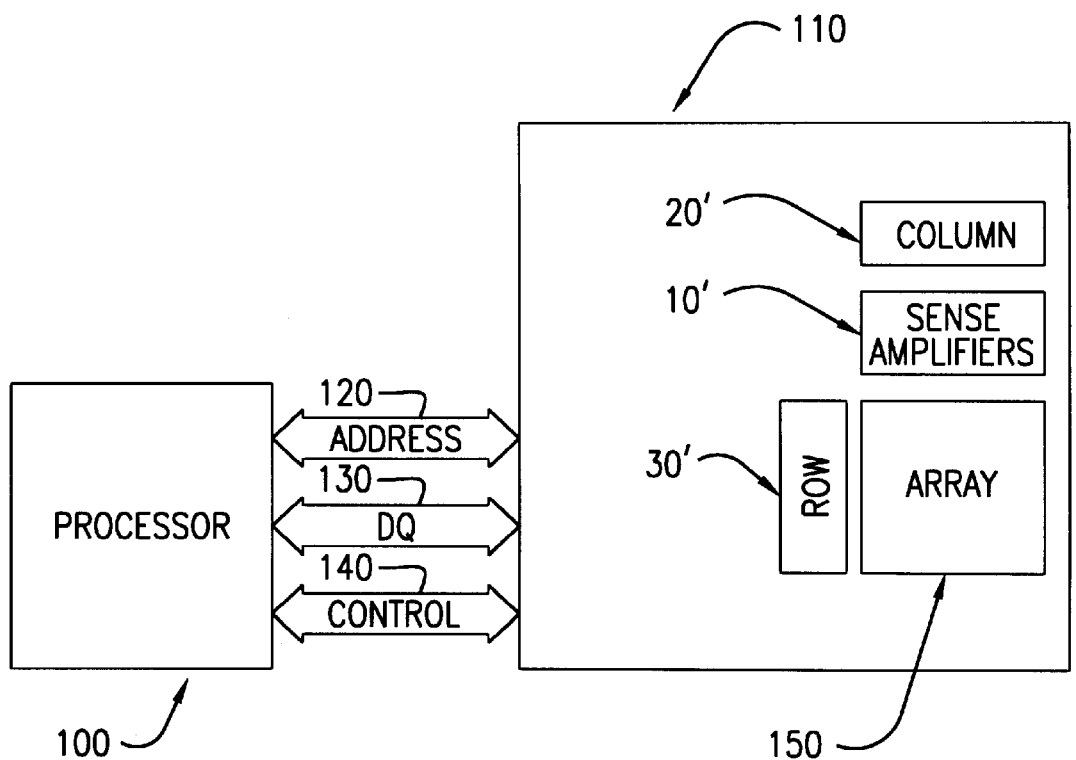
FIG. 6 is a block diagram showing a DRAM of the invention used in a computer system.

FIG. 6 shows a computer system in which the DRAM described above may be utilized. Most computers include a microprocessor and a memory which control the operations of the computer. FIG. 6 shows a microprocessor 100 which operates in conjunction with a dynamic random access memory circuit 110. The microprocessor sends address information 120, data 130 and control signals 140 to the DRAM circuit 110 in order to read information from and write information to the memory array 150. The memory array 150 consists of the memory banks B0 and B1, arranged as shown in FIG. 2. Also, shown in FIG. 6 are row decoder 30', column decoder 20', and sense amplifiers 10'. The data lines 130, labeled "DQ" are connected to the data path 40' shown in FIG. 2. When the microprocessor 100 needs to obtain information from the memory circuit 110 it sends address signals 120 and control signals 140 to it. The address signals 120 are fed to the row decoder 30' and column decoder 20', usually through an address buffer (not shown). The control signals 140, inform the memory circuit 110 as to what type of operation is being performed, i.e. reading or writing. The sense amplifiers 10' receive the information stored in the memory array 150 at the locations specified by the address signals 120. This information is then relayed back to the microprocessor 100 through the data path 40' (FIG. 2) and data lines 130. The process is similar when writing is performed except that the data lines 130 carry information from the microprocessor 100 to the memory circuit 110.

Although a preferred embodiment of the present invention has been described with reference to a two-bank array, it should be noted that the principles taught herein can be applied to memory arrays with 3 or more banks. Further, although the example given shows sub-banks which have 4 sub-banks in each group "a" or "b", it is within the scope of the present invention to utilize groups of 4 or more sub-banks (e.g., 8 sub-banks per group). Also, it should be noted that although the preferred embodiment of the present invention is directed to a DRAM with 32 I/Os, DRAMs with more or less than 32 I/Os (e.g. 8, 16, 64, 128, etc.) can be constructed utilizing the teachings outlined above.

It should be readily understood that the invention is not limited to the specific embodiment described and illustrated above. Rather, the invention can be modified to incorporate any number of variations, alterations, substitutions or equivalent arrangements not heretofore described, which are commensurate with the spirit and scope of the invention. Accordingly, the invention is not limited by the foregoing description, but is only limited by the scope of the appended claims.

What is claimed as new and desired to be protected by Letters Patent of the United States is:

1. A memory device comprising:
    a plurality of memory cells arranged into at least a first bank of memory cells and a second bank of memory cells, each of said banks of memory cells being further divided into at least two sub banks of memory cells,
    an input/output data path for data to be written into and read from said plurality of memory cells;
    said sub banks of memory cells being arranged such that at least one sub bank from each of said first and second banks of memory cells is located on one side of said data path and at least one sub bank from each of said first and second banks of memory cells is located the other side of said data path; and,
    circuitry for accessing said memory cells such that sub banks of the same bank of memory cells which are located on opposite sides of said data path, are accessed simultaneously in response to an input address signal.

2. The memory device as in claim 1 wherein said accessing circuitry is divided into:
    a first portion for accessing sub banks of memory cells located on one side of said data path, and
    a second portion for accessing sub banks of memory cells located on the other side of said data path, each accessing circuitry portion comprising:
        a respective row decoder for addressing word lines of an associated one of said sub banks of memory cells on one side of said data path;
        a respective sense amplifier circuit for sensing data bits on bit lines for an associated one of said sub banks of memory cells on said one side of said data path; and
        a column decoder for commonly addressing the bit lines of all the sub banks of the same one of said first and second memory banks which are located on said one side of said data path.

3. The memory circuit of claim 2, wherein each respective row decoder includes two internal row decoders, one for addressing rows of one of the at least two sub banks of the first bank and the other for addressing rows of one of the at least two sub banks of the second bank.

4. The memory circuit of claim 2, wherein the sense amplifiers located on one side of the data path output the same amount of data as the sense amplifiers located on the other side of the data path, each time the memory cells are simultaneously accessed by the accessing circuitry.

5. The memory circuit of claim 2, wherein the sense amplifiers are located above and below each of the at least two sub banks of each of the first and second banks.

6. The memory circuit of claim 2, wherein the number of banks is two and the number of sub banks is four, and where every other sub bank is accessed simultaneously by the accessing circuitry.

7. A computer system comprising:
    a microprocessor; and
    a memory circuit operating in cooperation with said microprocessor, said memory circuit comprising:
        a plurality of memory cells arranged into at least a first bank of memory cells and a second bank of memory cells, each of said banks of memory cells being further divided into at least two sub banks of memory cells,
        an input/output data path for data to be written into and read from said plurality of memory cells;
        said sub banks of memory cells being arranged such that at least one sub bank from each of said first and second banks of memory cells is located on one side of said data path and at least one sub bank from each of said first and second banks of memory cells is located on another side of said data path; and,
        circuitry for accessing said memory cells such that sub banks of the same bank of memory cells which are located on opposite sides of said data path, are accessed simultaneously in response to an input address signal.

8. The computer system of claim 7, the accessing circuitry further comprising:
    a first portion for accessing sub banks of memory cells located on one side of said data path, and
    a second portion for accessing sub banks of memory cells located on the other side of said data path, each accessing circuitry portion comprising:

a respective row decoder for addressing word lines of an associated one of said sub banks of memory cells on one side of said data path;

a respective sense amplifier circuit for sensing data bits on bit lines for an associated one of said sub banks of memory cells on said one side of said data path; and a column decoder for commonly addressing the bit lines of all the sub banks of the same one of said first and second memory banks which are located on said one side of said data path.

9. The computer system of claim 8, wherein each respective row decoder includes two internal row decoders, one for addressing rows of one of the at least two sub banks of the first bank and the other for addressing rows of one of the at least two sub banks of the second bank.

10. The computer system of claim 8, wherein the sense amplifiers located on one side of the data path output the same amount of data as the sense amplifiers located on the other side of the data path, each time the memory cells are simultaneously accessed by the accessing circuitry.

11. The computer system of claim 8, wherein the sense amplifiers are located above and below each of the at least two sub banks of each of the first and second banks.

12. The computer system of claim 8, wherein the number of banks is two and the number of sub banks is four, and where every other sub bank is accessed simultaneously by the accessing circuitry.

13. A method of arranging memory banks in a memory array comprising the steps of:

providing a plurality of memory cells arranged into at least a first bank of memory cells and a second bank of memory cells, each of said banks of memory cells being further divided into at least two sub banks of memory cells, providing an input/output data path for data to be written into and read from said plurality of memory cells;

arranging said sub banks such that at least one sub bank from each of said first and second banks of memory cells is located on one side of said data path and at least one sub bank from each of said first and second banks of memory cells is located on another side of said data path; and, providing circuitry for accessing said memory cells such that sub banks of the same bank of memory cells which are located on opposite sides of said data path, are accessed simultaneously in response to an input address signal.

14. The method of claim 13, wherein the step of providing accessing circuitry further includes:

providing a first portion of the accessing circuitry for accessing sub banks of memory cells located on one side of said data path, and providing a second portion of the accessing circuitry for accessing sub banks of memory cells located on the other side of said data path, each accessing circuitry portion comprising:

providing a respective row decoder for addressing word lines of an associated one of said sub banks of memory cells on one side of said data path;

providing a respective sense amplifier circuit for sensing data bits on bit lines for an associated one of said sub banks of memory cells on said one side of said data path; and providing a column decoder for commonly addressing the bit lines of all the sub banks of the same one of said first and second memory banks which are located on said one side of said data path.

15. The method of claim 14, wherein the step of providing a row decoder comprises:

providing two internal row decoders for each respective row decoder, one for addressing rows of one of the at least two sub banks of the first bank and the other for addressing rows of one of the at least two sub banks of the second bank.

16. The method of claim 14, wherein the step of providing sense amplifiers comprises:

providing sense amplifiers on one side of the data path which output the same amount of data as the sense amplifiers provided on the other side of the data path, each time the memory cells are simultaneously accessed by the accessing circuitry.

17. A method of operating a memory circuit comprising the steps of:

supplying an address signal to a memory circuit specifying certain locations within a memory array, said memory array being divided into at least a first bank of memory cells and a second bank of memory cells, said first and second memory banks being further divided into at least two sub banks wherein each sub bank is located at one side of a common data path;

providing the address signal to address decoding circuitry for addressing each sub bank;

accessing data, from the locations specified by the address signal, from each of the at least two sub banks of a memory bank simultaneously; and, transmitting said data onto said data path.

18. The method of claim 17, wherein the amount of data simultaneously accessed from each sub bank is the same.

19. The method of claim 17, wherein the address decoding circuitry for each sub bank includes at least one row decoder.

20. The method of claim 17, wherein the number of banks is two, the number of sub banks is four, and where non-adjacent sub banks are accessed simultaneously.

* * * * *

UNITED STATES PATENT AND TRADEMARK OFFICE
CERTIFICATE OF CORRECTION

PATENT NO. : 5,978,302
DATED : November 2, 1999
INVENTOR(S) : Todd A. Merritt

It is certified that error appears in the above-identified patent and that said Letters Patent is hereby corrected as shown below:

Column 3, line 8, change the second occurrence of "1" to --0--.

Signed and Sealed this

Sixteenth Day of May, 2000

Attest:

Q. TODD DICKINSON

Attesting Officer

Director of Patents and Trademarks